(12) United States Patent
Park et al.

(10) Patent No.: US 11,407,328 B2
(45) Date of Patent: Aug. 9, 2022

(54) VEHICLE BATTERY DIAGNOSIS APPARATUS, BATTERY DIAGNOSIS METHOD THEREOF, AND VEHICLE INCLUDING VEHICLE BATTERY DIAGNOSIS APPARATUS

(71) Applicants: HYUNDAI MOTOR COMPANY, Seoul (KR); KIA MOTORS CORPORATION, Seoul (KR)

(72) Inventors: Man Jae Park, Hwaseong-si (KR); Joong Woo Lee, Yongin-si (KR); Jin Geun Bae, Daegu (KR); Myung Won Lee, Seongnam-si (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 572 days.

(21) Appl. No.: 16/567,574

(22) Filed: Sep. 11, 2019

(65) Prior Publication Data
US 2020/0391610 A1   Dec. 17, 2020

(30) Foreign Application Priority Data
Jun. 14, 2019   (KR) .................. 10-2019-0070761

(51) Int. Cl.
*B60L 58/12* (2019.01)
*B60L 58/22* (2019.01)
(Continued)

(52) U.S. Cl.
CPC .............. *B60L 58/12* (2019.02); *B60L 58/22* (2019.02); *G01R 31/389* (2019.01);
(Continued)

(58) Field of Classification Search
CPC ...... B60L 58/12; B60L 58/22; B60L 2240/54; B60L 2240/547; B60L 2240/80;
(Continued)

(56) References Cited

U.S. PATENT DOCUMENTS

| 9,927,492 | B2 * | 3/2018 | Lupo ................. G01R 31/389 |
| 10,946,765 | B2 * | 3/2021 | Park .................... B60L 58/13 |
| 2015/0070024 | A1 * | 3/2015 | Kim .................... H01M 10/48 |
| | | | 324/430 |

FOREIGN PATENT DOCUMENTS

CN          105738833 A  *  7/2016  ............. G01R 27/08

\* cited by examiner

*Primary Examiner* — M Baye Diao
(74) *Attorney, Agent, or Firm* — Morgan, Lewis & Bockius LLP (57) ABSTRACT

A vehicle battery diagnosis apparatus includes: a measurement unit configured to measure a battery cell voltage; and a controller configured to diagnose a cell voltage deviation based on the battery cell voltage. The controller calculates a self-discharge rate for each cell based on the battery cell voltage and a parking time and calculates the cell voltage deviation based on the battery cell voltage, and when the calculated cell voltage deviation is greater than a preset cell balancing reference voltage deviation, the controller compares cell balancing capacitance calculated based on a vehicle usage time with a maximum self-discharge rate among the calculated self-discharge rates for respective cells and determines whether cell balancing is enabled or diagnoses the cell voltage deviation.

20 Claims, 6 Drawing Sheets

(51) Int. Cl.
    *G07C 5/08*           (2006.01)
    *G01R 31/3835*     (2019.01)
    *G01R 31/389*      (2019.01)
    *G01R 31/396*      (2019.01)

(52) U.S. Cl.
    CPC ....... *G01R 31/3835* (2019.01); *G01R 31/396* (2019.01); *G07C 5/0808* (2013.01); *B60L 2240/54* (2013.01)

(58) Field of Classification Search
    CPC .... B60L 2260/22; B60L 3/0046; B60L 58/10; B60L 3/0092; G01R 31/3835; G01R 31/389; G01R 31/396; G01R 31/392; G01R 31/388; G07C 5/0808; H02J 7/0016; H02J 7/0048; Y02T 10/70; Y02T 90/40; B60Y 2200/91; B60Y 2200/92
    USPC ....................................................... 701/33.7
    See application file for complete search history.

VEHICLE BATTERY DIAGNOSIS APPARATUS, BATTERY DIAGNOSIS METHOD THEREOF, AND VEHICLE INCLUDING VEHICLE BATTERY DIAGNOSIS APPARATUS

CROSS REFERENCE TO RELATED APPLICATION

This application claims the benefit of Korean Patent Application 10-2019-0070761, filed on Jun. 14, 2019 in the Korean Intellectual Property Office, the entirety of which is hereby incorporated by reference herein.

TECHNICAL FIELD

The present disclosure relates to a vehicle battery diagnosis apparatus, and more particularly, to a vehicle battery diagnosis apparatus, a battery diagnosis method thereof, and a vehicle including the vehicle battery diagnosis apparatus, for performing advanced prevention diagnosis of voltage deviation error of a high-voltage battery and performing advanced prevention diagnosis in consideration of cell balancing capacitance to which the self-discharge rate and customer characteristics of a high-voltage battery are applied.

BACKGROUND

In general, a high-voltage battery is a necessary component of an electric motored vehicle (e.g., hybrid electric vehicle (HEV), plug-in hybrid electric vehicle (PHEV), battery electric vehicle (BEV), fuel cell electric vehicle (FCEV), etc.) and may configure various battery packs according to required specifications for respective vehicle types.

A battery pack may be configured by a serial/parallel combination of cells, and battery cells may have a voltage deviation due to accumulation of charge and discharge efficiency differences and a difference of self-discharge rate (fine short due to internal impurities).

That is, battery cells may have a voltage deviation even in the same battery pack system.

In order to control such a voltage deviation between cells, a balancing circuit may be established in units of cells to prevent the voltage deviation through resistance discharge.

However, even if a voltage deviation between cells is prevented using a balancing circuit in units of cells, the voltage deviation between cells may be increased to a voltage deviation that affects a system.

In this case, after a voltage deviation between cells is largely increased, a vehicle may diagnose a battery and may display battery fault.

As such, when a battery is damaged in an unexpected situation due to a voltage deviation between cells, a vehicle driver is not capable of expecting battery damage and thus may experience a difficulty in vehicle driving.

Accordingly, in the future, there is a need for a battery diagnosis apparatus for pre-detecting voltage deviation error of a high-voltage battery and performing advanced prevention diagnosis in consideration of cell balancing capacitance to which the self-discharge rate and customer characteristics of a high-voltage battery are applied.

SUMMARY

Accordingly, the present disclosure is directed to a vehicle battery diagnosis apparatus, a battery diagnosis method thereof, and a vehicle including the vehicle battery diagnosis apparatus that substantially obviates one or more problems due to limitations and disadvantages of the related art.

An object of the present disclosure is to provide a vehicle battery diagnosis apparatus, a battery diagnosis method thereof, and a vehicle including the vehicle battery diagnosis apparatus, for calculating a self-discharge rate of a battery based on a cell voltage of a high-voltage battery and a parking time and calculating cell balancing capacitance based on the vehicle usage time, and for pre-detecting voltage deviation error of the high-voltage battery through comparison between the self-discharge rate of the high-voltage battery and the cell balancing capacitance to which customer characteristics are applied, and accordingly advanced prevention diagnosis may be performed and safe battery maintenance may be guided.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, a vehicle battery diagnosis apparatus according to an aspect of the present disclosure includes: a measurement unit configured to measure a battery cell voltage; and a controller configured to diagnose a cell voltage deviation based on the battery cell voltage, wherein the controller calculates a self-discharge rate for each cell based on the battery cell voltage and a parking time and calculates the cell voltage deviation based on the battery cell voltage, and when the calculated cell voltage deviation is greater than a preset cell balancing reference voltage deviation, the controller compares cell balancing capacitance calculated based on a vehicle usage time with a maximum self-discharge rate among the calculated self-discharge rates for respective cells and determines whether cell balancing is enabled or diagnoses the cell voltage deviation.

In another aspect of the present disclosure, a battery diagnosis method of a vehicle battery diagnosis apparatus including a controller configured to diagnose a cell voltage deviation based on a battery cell voltage includes: when a vehicle is turned on (IG ON), calculating a self-discharge rate for each cell based on the battery cell voltage and a parking time and calculating a cell voltage deviation based on the battery cell voltage, by the controller; checking whether the calculated cell voltage deviation is greater than a preset cell balancing reference voltage deviation, by the controller; when the calculated cell voltage deviation is greater than the cell balancing reference voltage deviation, checking whether cell balancing capacitance calculated based on a vehicle usage time is greater than a maximum self-discharge rate among the calculated self-discharge rates for respective cells, by the controller; when the cell balancing capacitance is greater than the maximum self-discharge rate, determining that cell balancing is enabled; and when the cell balancing capacitance is equal to or less than the maximum self-discharge rate, diagnosing the cell voltage deviation, by the controller.

In another aspect of the present disclosure, a battery diagnosis method of a vehicle battery diagnosis apparatus including a controller configured to diagnose a cell voltage deviation based on a battery cell voltage includes: when a vehicle is turned on (IG ON), calculating a parking time, by the controller, calculating a self-discharge rate for each cell based on the measured battery cell voltage and the calculated parking time, and a maximum self-discharge rate among the self-discharge rates for respective cells; and calculating the cell voltage deviation based on the battery cell voltage, by the controller; checking whether the calculated cell voltage deviation is greater than a preset cell balancing reference voltage deviation, by the controller; when the calculated cell voltage deviation is greater than the cell balancing reference voltage deviation, checking whether cell balancing capacitance calculated based on a vehicle usage time is greater than the maximum self-discharge rate, by the controller; when the cell balancing capacitance is greater than the maximum self-discharge rate, determining that cell balancing is enabled, and when the cell balancing capacitance is equal to or less than the maximum self-discharge rate, diagnosing the cell voltage deviation, by the controller; when the vehicle is turned off (IG OFF), storing a voltage for each cell of the battery and calculating the vehicle usage time, by the controller; calculating and obtaining an average usage time based on the vehicle usage time, by the controller; and calculating the cell balancing capacitance based on the average usage time and storing the cell balancing capacitance, by the controller.

In another aspect of the present disclosure, a computer readable recording medium having recorded thereon a program for executing the battery diagnosis method of the vehicle battery diagnosis apparatus.

In another aspect of the present disclosure, a vehicle includes a battery, and a battery diagnosis apparatus configured to measure a battery cell voltage and to diagnose a cell voltage deviation, wherein the battery diagnosis apparatus calculates a self-discharge rate for each cell based on the battery cell voltage and a parking time and calculates a cell voltage deviation based on the battery cell voltage, and when the calculated cell voltage deviation is greater than a preset cell balancing reference voltage deviation, the battery diagnosis apparatus compares cell balancing capacitance calculated based on a vehicle usage time with a maximum self-discharge rate among the calculated self-discharge rates for respective cells and determines whether cell balancing is enabled or diagnoses the cell voltage deviation.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Exemplary embodiments of the present disclosure are described in detail so as for those of ordinary skill in the art to easily implement the disclosure with reference to the accompanying drawings. However, the present disclosure may be implemented in various different forms and is not limited to these embodiments. To clearly describe the present disclosure, parts unrelated to the description are omitted in the drawings and like reference numerals in the specification denote like elements.

Throughout the specification, one of ordinary skill would understand terms "include", "comprise", and "have" to be interpreted by default as inclusive or open rather than exclusive or closed unless expressly defined to the contrary. Further, terms such as "unit", "module", etc. disclosed in the specification average units for processing at least one function or operation, which may be implemented by hardware, software, or a combination thereof.

Throughout the specification, when a certain part "includes" a certain component, this indicates that the part may further include another component instead of excluding another component unless there is no different disclosure. The same reference numbers will be used throughout the drawings to refer to the same parts.

Hereinafter, a vehicle battery diagnosis apparatus, a battery diagnosis method thereof, and a vehicle including the vehicle battery diagnosis apparatus, which are applicable to embodiments of the present disclosure, will be described in detail with reference to FIGS. 1 to 6.

Figure 1:
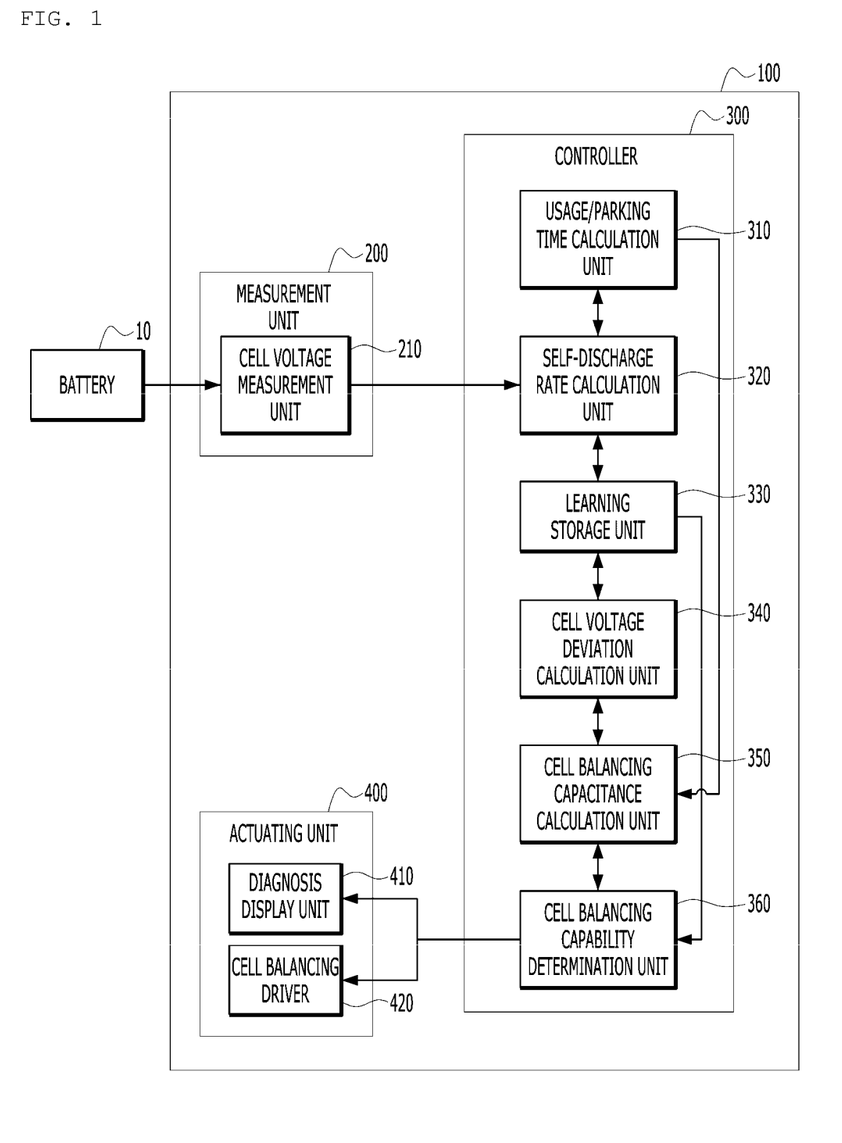
FIG. 1 is a block diagram for explanation of a vehicle battery diagnosis apparatus according to an exemplary embodiment of the present disclosure.

FIG. 1 is a block diagram for explanation of a vehicle battery diagnosis apparatus according to an exemplary embodiment of the present disclosure.

Referring to FIG. 1, a vehicle battery diagnosis apparatus 100 according to the present disclosure may include a measurement unit 200 configured to measure a battery cell voltage, and a controller 300 configured to diagnose a cell voltage deviation based on the battery cell voltage. The measurement unit 200 may be a sensor, e.g., a voltmeter, etc.

Here, the controller 300 may include a usage and parking time calculation unit 310, a self-discharge rate calculation unit 320, a learning storage unit 330, a cell voltage deviation calculation unit 340, a cell balancing capacitance calculation unit 350, and a cell balancing capability determination unit 360.

The usage and parking time calculation unit 310 may calculate a vehicle parking time and a vehicle usage time.

The self-discharge rate calculation unit 320 may calculate a self-discharge rate for each cell based on the battery cell voltage and the parking time.

Then, the learning storage unit 330 may obtain and store the self-discharge rate for each cell and cell balancing capacitance.

Then, the cell voltage deviation calculation unit 340 may calculate a cell voltage deviation based on the battery cell voltage.

The cell balancing capacitance calculation unit 350 may calculate cell balancing capacitance based on a balancing circuit discharge rate and a daily average vehicle usage time.

Then, when the calculated cell voltage deviation is greater than a preset cell balancing reference voltage deviation, the cell balancing capability determination unit 360 may compare the calculated cell balancing capacitance with a maximum self-discharge rate among the calculated self-discharge rates for respective cells and may determine whether cell balancing is enabled or may diagnose the cell voltage deviation.

The vehicle battery diagnosis apparatus 100 according to the present disclosure may further include an actuating unit 400 including a cell balancing driver 420 configured to perform cell balancing of a battery according to a control signal of the controller 300, and a diagnosis display unit 410 configured to display diagnosis information on diagnosis of the cell voltage deviation according to the control signal of the controller 300. The diagnosis display unit 410 may be a hardware device for visually outputting information.

The controller 300 of the vehicle battery diagnosis apparatus 100 according to the present disclosure may calculate the self-discharge rate for each cell based on the cell voltage and the parking time of a battery 10 and may calculate a cell voltage deviation based on the battery cell voltage, and when the calculated cell voltage deviation is greater than the preset cell balancing reference voltage deviation, the controller 300 may compare the cell balancing capacitance calculated based on the vehicle usage time with the maximum self-discharge rate among the calculated self-discharge rates for respective cells and may determine whether cell balancing is enabled or may diagnose the cell voltage deviation.

Here, when the controller 300 calculates the self-discharge rate for each cell, if a vehicle is turned on (IG ON), the controller 300 may calculate the parking time and may calculate the self-discharge rate for each cell based on the measured battery cell voltage and the calculated parking time.

For example, when calculating the parking time, the controller 300 may calculate the parking time according to an equation "Parking time=Most recently IG OFF time−IG ON time".

When calculating the self-discharge rate for each cell, the controller 300 may calculate the self-discharge rate for each cell according to an equation "Self-discharge rate for each cell=(Most recently IG OFF voltage−Cell voltage)/Parking time".

When calculating the cell voltage deviation, the controller 300 may calculate the cell voltage deviation according to an equation "Cell voltage deviation $\Delta V$=Maximum cell voltage $V_{cellmax}$−Minimum cell voltage $V_{cellmin}$".

Then, when calculating the self-discharge rate for each cell, the controller 300 may calculate the maximum self-discharge rate after the self-discharge rate for each cell is calculated.

When calculating the maximum self-discharge rate, the controller 300 may calculate the maximum self-discharge rate according to an equation "Maximum self-discharge rate $V_{dischargemax}$=Max(Self-discharge rate for each cell)".

Then, when comparing the maximum self-discharge rate with the cell balancing capacitance, the controller 300 may calculate the cell balancing capacitance based on the vehicle usage time, may store the cell balancing capacitance, may extract the stored cell balancing capacitance, and may compare the extracted cell balancing capacitance with the maximum self-discharge rate.

Here, when calculating the cell balancing capacitance based on the vehicle usage time, if the vehicle is turned off (IG OFF), the controller 300 may calculate the vehicle usage time, may calculate and obtain an average usage time based on the vehicle usage time, and may calculate the cell balancing capacitance based on the average usage time.

For example, when calculating and obtaining the average usage time, the controller 300 may calculate the average usage time according to an equation "Average usage time=AVG(Usage time of n number of times)".

For example, when calculating the cell balancing capacitance, the controller 300 may calculate the cell balancing capacitance according to an equation "Cell balancing capacitance=Balancing circuit discharge rate (mV/hr)*(Average usage time/24 hr)".

Then, when comparing the maximum self-discharge rate with the cell balancing capacitance, the controller 300 may check whether the calculated cell voltage deviation $\Delta V$ is greater than a preset cell balancing reference voltage deviation $\Delta V_{balancing}$, and when the cell voltage deviation $\Delta V$ is greater than the cell balancing reference voltage deviation $\Delta V_{balancing}$, the controller 300 may compare the maximum self-discharge rate with the cell balancing capacitance.

When the controller 300 checks whether the calculated cell voltage deviation $\Delta V$ is greater than the preset cell balancing reference voltage deviation $\Delta V_{balancing}$, if the cell voltage deviation $\Delta V$ is equal to or less than the cell balancing reference voltage deviation $\Delta V_{balancing}$, the controller 300 may not diagnose a cell voltage deviation of the battery or may not perform cell balancing.

When the controller 300 compares the maximum self-discharge rate with the cell balancing capacitance, if the maximum self-discharge rate is smaller than the cell balancing capacitance, the controller 300 may determine that cell balancing is enabled.

Upon determining that cell balancing is enabled, the controller 300 may control the cell balancing driver 420 to perform cell balancing.

When the controller 300 compares the maximum self-discharge rate with the cell balancing capacitance, if the maximum self-discharge rate is equal to or greater than the cell balancing capacitance, the controller 300 may diagnose a cell voltage deviation of a battery.

Here, when diagnosing the cell voltage deviation of the battery, the controller 300 may control the diagnosis display unit 410 to display diagnosis information on diagnosis of the cell voltage deviation.

Then, when the vehicle is turned off (IG OFF), the controller 300 may calculate the vehicle usage time, may calculate and obtain the average usage time based on the vehicle usage time, may calculate cell balancing capacitance based on the average usage time, and may store the cell balancing capacitance.

For example, when calculating and obtaining the average usage time, the controller 300 may calculate the average usage time according to an equation "Average usage time=AVG(Usage time of n number of times)".

For example, when calculating the cell balancing capacitance, the controller 300 may calculate the cell balancing capacitance according to an equation "Cell balancing capacitance=Balancing circuit discharge rate (mV/hr)*(Average usage time/24 hr)".

The controller 300 may store a voltage for each cell of a battery when the vehicle is turned off (IG OFF).

As such, according to the present disclosure, the self-discharge characteristics of the high-voltage battery during parking and cell discharge capacitance (circuit discharge capacitance*daily average usage rate) based on the customer usage characteristics may be compared to determine whether a cell deviation is continuously increased, and then a battery in which a potential cell voltage deviation occurs to perform advanced prevention diagnosis.

That is, according to the present disclosure, the self-discharge rate of a battery may be calculated based on the cell voltage of the high-voltage battery and the parking time, and the cell balancing capacitance may be calculated based on the vehicle usage time, and the voltage deviation error of the high-voltage battery may be pre-detected through comparison between the self-discharge rate of the high-voltage battery and the cell balancing capacitance to which customer characteristics are applied, and accordingly advanced prevention diagnosis may be performed and safe battery maintenance may be guided.

According to the present disclosure, whether it is possible to prevent a continuous voltage deviation that occurs due to self-discharge of the high-voltage battery may be determined through a cell balancing circuit applied to a system.

Accordingly, according to the present disclosure, when a deviation is determined to be continuously increased, diagnosis information may be previously provided to a customer and preventive maintenance may be performed before abnormality occurs in the vehicle due to an excessive deviation.

Figure 2:
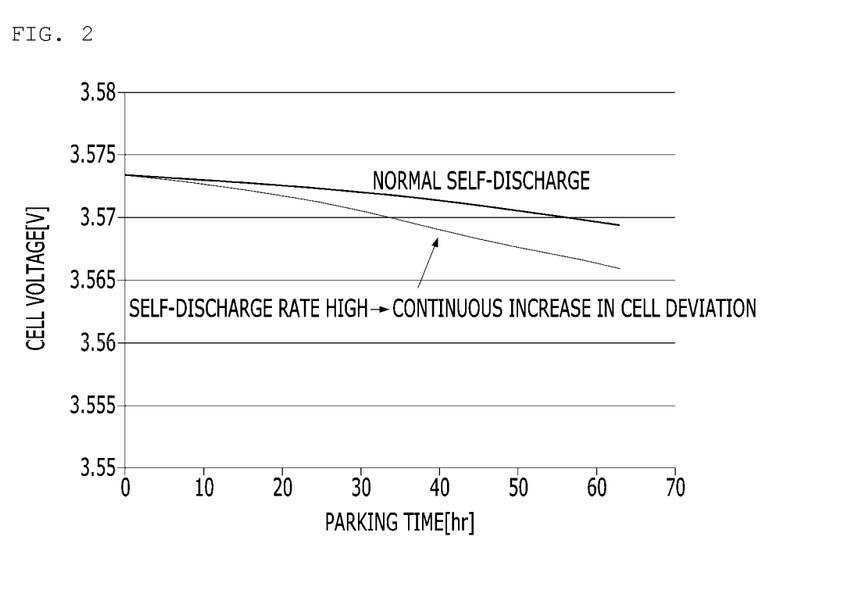
FIG. 2 is a graph for explanation of a voltage deviation due to self-discharge of a battery cell.
Figure 3:
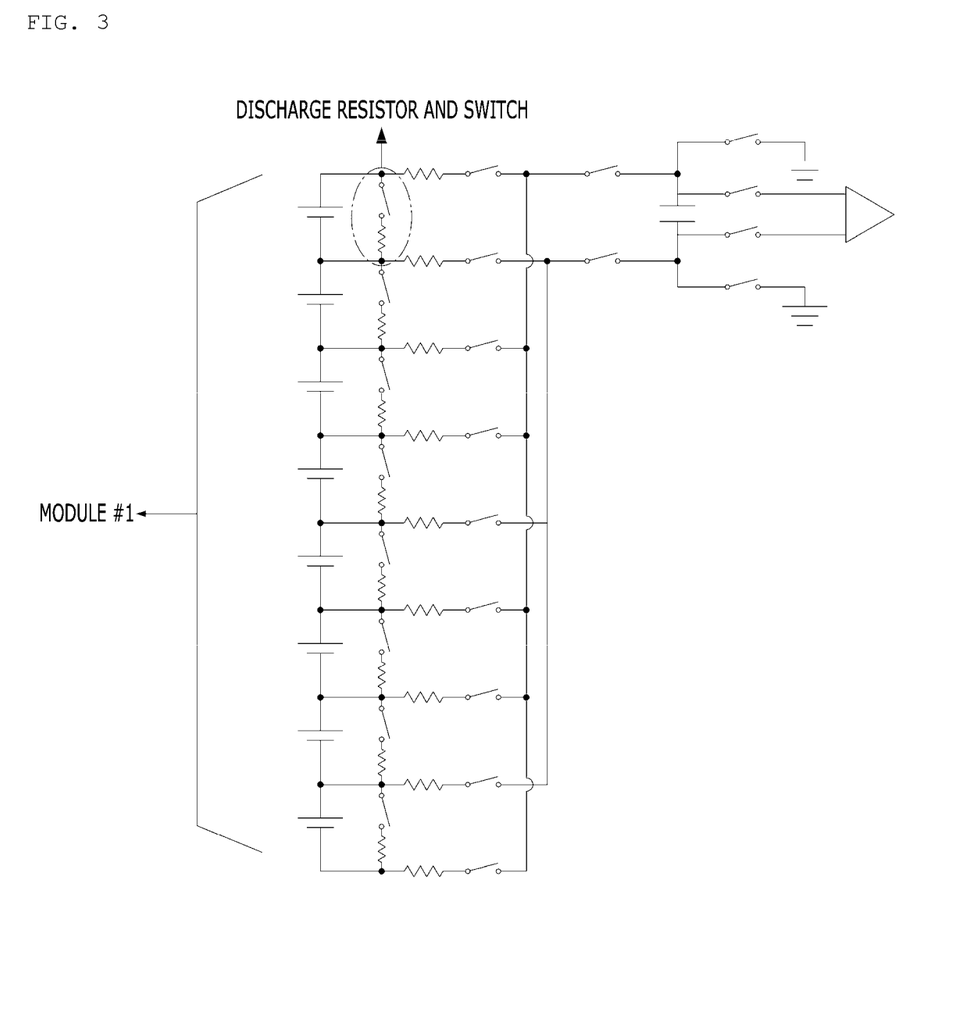
FIG. 3 is a circuit diagram showing a cell balancing circuit for reducing a voltage deviation between battery cells.
Figure 4:
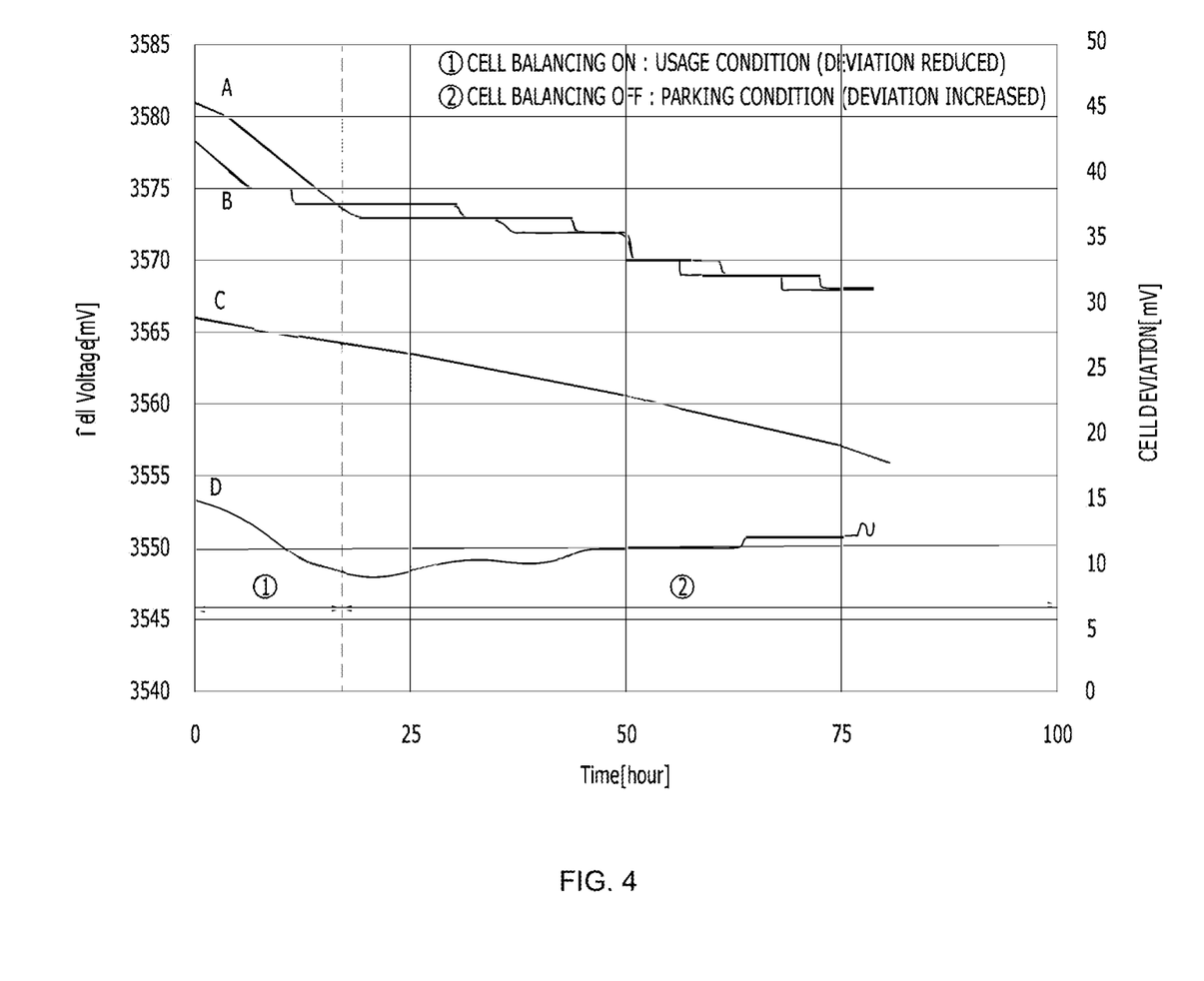
FIG. 4 is a graph for explanation of a voltage deviation between cells according to a battery usage time.

FIG. 2 is a graph for explanation of a voltage deviation due to self-discharge of a battery cell. FIG. 3 is a circuit diagram showing a cell balancing circuit for reducing a voltage deviation between battery cells. FIG. 4 is a graph for explanation of a voltage deviation between cells according to a battery usage time.

As shown in FIG. 2, the high-voltage battery may have a greater self-discharge rate of the battery cell than a self-discharge rate of a normal battery cell in terms of the battery characteristics, and accordingly, as a parking time of the vehicle increases, a voltage deviation may be continuously increased.

As such, when the voltage deviation is increased, a cell with a high voltage may be forcibly discharged using the cell balancing circuit to reduce the voltage deviation, as shown in FIG. 3.

However, as seen from FIG. 4, when a voltage deviation between cells occurs, an effect of a balancing function may be changed according to a vehicle usage condition of a customer.

As shown in FIG. 4, even if the same cell deviation occurs, the deviation may be capable of being reduced with respect to customers A, B, and C with a long average usage time (with a high cell balancing operating ratio), and the deviation may be continuously increased with respect to a customer D with a short average usage time (with a low cell balancing operating ratio).

That is, a cell balancing discharge rate (mV/hr) that is present in the system in terms of hardware may be multiplied by a daily average usage time rate of a customer to calculate cell balancing capacitance that is capable of corresponding to reduction of a deviation in the corresponding battery.

When a self-discharge rate of a cell becomes greater than the cell balancing capacitance of the corresponding battery (in consideration of a usage condition), even if the balancing circuit is operated, a deviation may be ultimately and continuously increased and rapid diagnosis may occur during a vehicle drive, and accordingly, according to the present disclosure, when a specific condition (discharge capacitance<self-discharge rate) is detected, battery diagnosis may be previously guided through advanced prevention diagnosis.

For example, when a self-discharge rate of a battery cell in which a deviation is caused is about 1 mV/hr and a cell balancing circuit discharge rate of the system is about 5 mV/hr, according to the present disclosure, whether to perform battery cell diagnosis for each customer may be determined as follows.

First, cell balancing capacitance of a customer with a daily average usage time of 6 hours is 5 mV/hr*(6 hr/24 hr)=1.25 mV/hr>1 mV/hr(self-discharge rate), and thus cell balancing may be performed.

In addition, cell balancing capacitance of a customer with a daily average usage time of 3 hours is 5 mV/hr*(3 hr/24 hr)=0.625 mV/hr<1 mV/hr(self-discharge rate), and thus diagnosis may be performed.

Figure 5:
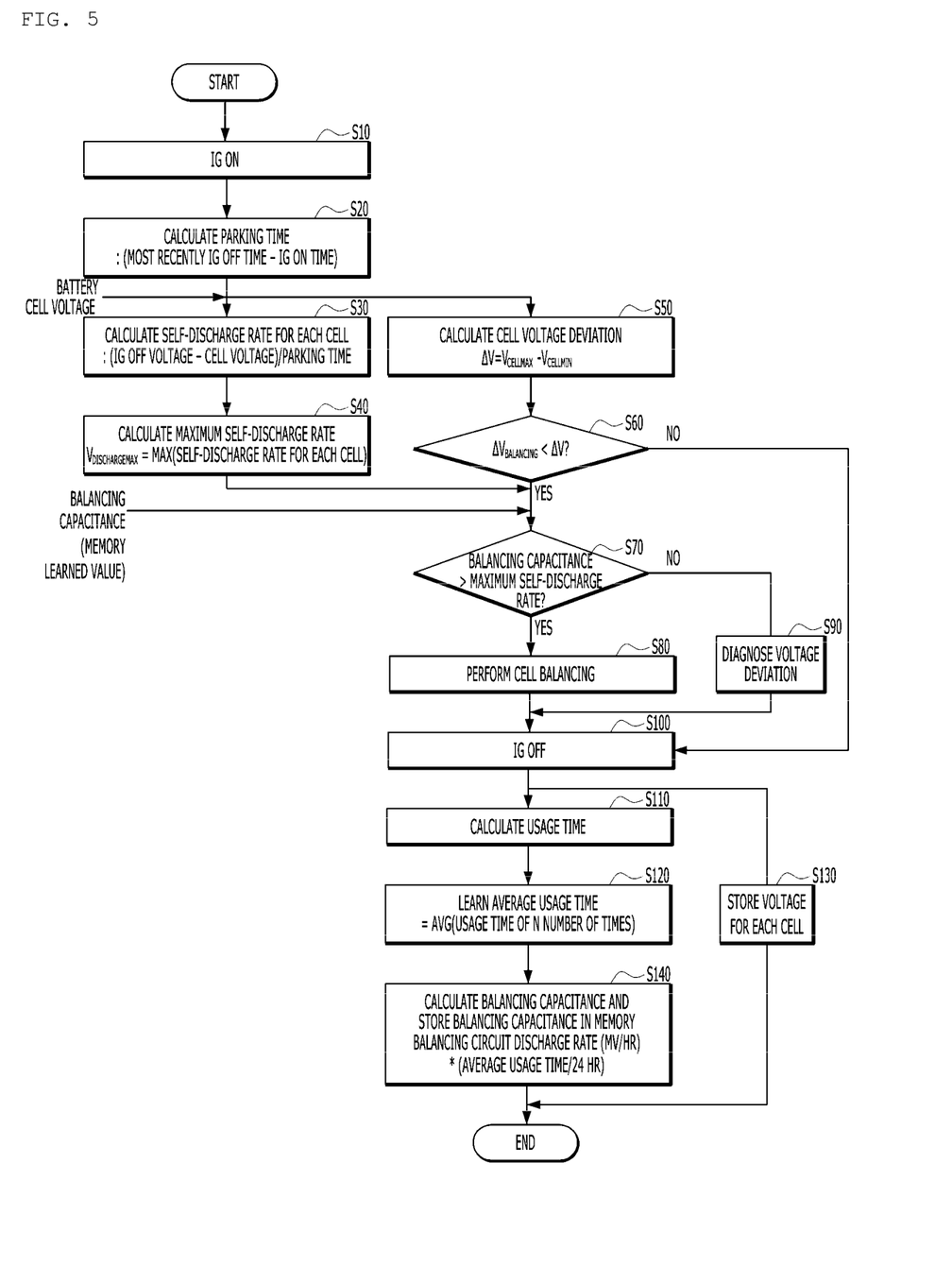
FIG. 5 is a flowchart of a battery diagnosis method of a vehicle battery diagnosis apparatus according to an exemplary embodiment of the present disclosure.

FIG. 5 is a flowchart of a battery diagnosis method of a vehicle battery diagnosis apparatus according to an exemplary embodiment of the present disclosure.

With reference to FIG. 5, a battery diagnosis method of a vehicle battery diagnosis apparatus including a controller configured to diagnose a cell voltage deviation based on a battery cell voltage will be described below.

First, when a vehicle is turned on (IG ON) (S10), the controller may calculate a parking time (S20).

Here, the controller may calculate the parking time according to an equation "Parking time=Most recently IG OFF time−IG ON time".

Then, upon calculating the parking time, the controller may calculate a self-discharge rate for each cell based on the measured battery cell voltage and the calculated parking time (S30).

Here, the controller may calculate the self-discharge rate for each cell according to an equation "Self-discharge rate for each cell=(Most recently IG OFF voltage−Cell voltage)/Parking time".

Upon calculating the self-discharge rate for each cell, the controller may calculate a maximum self-discharge rate (S40).

Here, the controller may calculate the maximum self-discharge rate according to an equation "Maximum self-discharge rate $V_{dischargemax}$=Max(Self-discharge rate for each cell).

The controller may calculate a cell voltage deviation based on the measured battery cell voltage (S50).

Here, the controller may calculate the cell voltage deviation according to an equation "Cell voltage deviation $\Delta V$=Maximum cell voltage $V_{cellmax}$−Minimum cell voltage $V_{cellmin}$".

Then, the controller may check whether the calculated cell voltage deviation is greater than a preset cell balancing reference voltage deviation (S60).

Here, when the cell voltage deviation is equal to or less than the cell balancing reference voltage deviation, the controller may not diagnose the cell voltage deviation of the battery or may not perform cell balancing.

Then, when the calculated cell voltage deviation is greater than the cell balancing reference voltage deviation, the controller may check whether the cell balancing capacitance calculated based on the vehicle usage time is greater than the maximum self-discharge rate (S70).

When the cell balancing capacitance is greater than the maximum self-discharge rate, the controller may determine that cell balancing is enabled (S80).

Here, upon determining that the cell balancing is enabled, the controller may perform the cell balancing of the battery.

When the cell balancing capacitance is equal to or less than the maximum self-discharge rate, the controller may diagnose the cell voltage deviation (S90).

When the cell voltage deviation of the battery is performed, the controller may display diagnosis information on diagnosis of the cell voltage deviation.

Then, when the vehicle is turned off (IG OFF) (S100), the controller may store a voltage for each cell of the battery (S130).

When the vehicle is turned off (IG OFF) (S100), the controller may calculate a vehicle usage time (S110).

The controller may calculate and obtain an average usage time based on the vehicle usage time (S120).

Here, the controller may calculate the average usage time according to an equation "Average usage time=AVG(Usage time of n number of times)".

Then, the controller may calculate cell balancing capacitance based on the average usage time and may store the cell balancing capacitance (S140).

Here, the controller may calculate the cell balancing capacitance according to an equation "Cell balancing capacitance=Balancing circuit discharge rate (mV/hr)*(Average usage time/24 hr).

Figure 6:
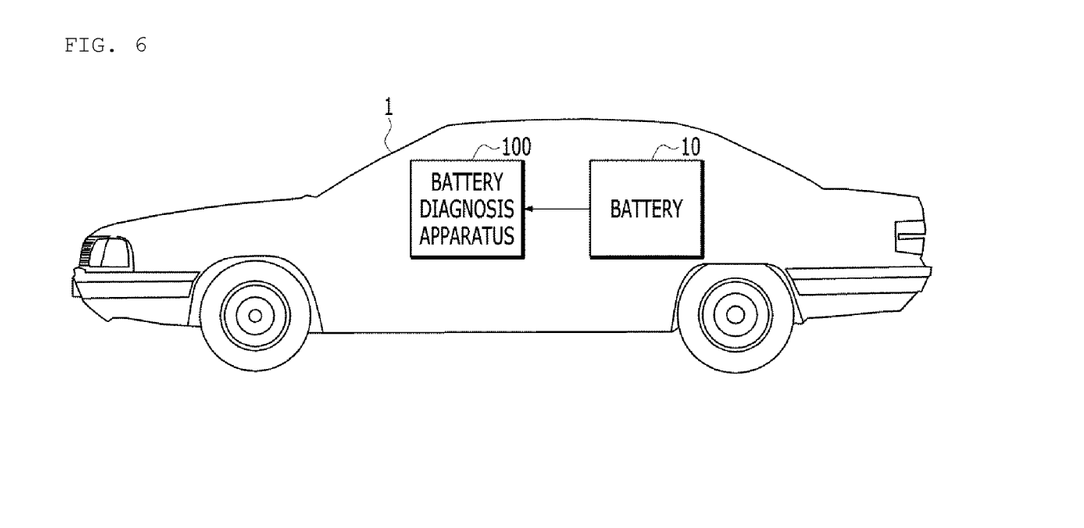
FIG. 6 is a diagram for explanation of a vehicle including a vehicle battery diagnosis apparatus according to an exemplary embodiment of the present disclosure.

FIG. 6 is a diagram for explanation of a vehicle including a vehicle battery diagnosis apparatus according to an exemplary embodiment of the present disclosure.

As shown in FIG. 6, a vehicle 1 may include the battery 10 and the battery diagnosis apparatus 100 configured to measure a cell voltage of the battery 10 and to diagnose a cell voltage deviation.

Here, the battery diagnosis apparatus 100 may calculate the self-discharge rate for each cell based on the cell voltage and the parking time of the battery 10 and may calculate a cell voltage deviation based on the battery cell voltage, and when the calculated cell voltage deviation is greater than the preset cell balancing reference voltage deviation, the battery diagnosis apparatus 100 may compare the cell balancing capacitance calculated based on the vehicle usage time with the maximum self-discharge rate among the calculated self-discharge rates for respective cells and may determine whether cell balancing is enabled or may diagnose the cell voltage deviation.

According to the present disclosure, a computer readable recording medium having recorded thereon a program for executing a battery diagnosis method of a vehicle battery diagnosis apparatus may perform procedures provided in the battery diagnosis method of the vehicle battery diagnosis apparatus according to an embodiment of the present disclosure.

As such, according to the present disclosure, the self-discharge rate of a battery may be calculated based on the cell voltage of the high-voltage battery and the parking time, and the cell balancing capacitance may be calculated based on the vehicle usage time, and the voltage deviation error of the high-voltage battery may be pre-detected through comparison between the self-discharge rate of the high-voltage battery and the cell balancing capacitance to which customer characteristics are applied, and accordingly advanced prevention diagnosis may be performed and safe battery maintenance may be guided.

That is, according to the present disclosure, whether it is possible to prevent a continuous voltage deviation that occurs due to self-discharge of the high-voltage battery may be determined through a cell balancing circuit applied to a system.

Accordingly, according to the present disclosure, when a deviation is determined to be continuously increased, diagnosis information may be previously provided to a customer and preventive maintenance may be performed before abnormality occurs in the vehicle due to an excessive deviation.

As such, the present disclosure may facilitate improvement in vehicle marketability through prevention diagnosis of a battery.

The vehicle battery diagnosis apparatus, the battery diagnosis method thereof, and the vehicle including the vehicle battery diagnosis apparatus, related to at least one embodiment of the present disclosure configured as described above, may calculate the self-discharge rate of a battery based on the cell voltage of a high-voltage battery and a parking time and may calculate cell balancing capacitance based on the vehicle usage time, and may pre-detect voltage deviation error of the high-voltage battery through comparison between the self-discharge rate of the high-voltage battery and the cell balancing capacitance to which customer characteristics are applied, and accordingly, advanced prevention diagnosis may be performed and safe battery maintenance may be guided.

That is, according to the present disclosure, whether it is possible to prevent a continuous voltage deviation that occurs due to self-discharge of the high-voltage battery may be determined through a cell balancing circuit applied to the system.

Accordingly, according to the present disclosure, when a deviation is determined to be continuously increased, diagnosis information may be previously provided to a customer and preventive maintenance may be performed before abnormality occurs in the vehicle due to an excessive deviation.

As such, the present disclosure may facilitate improvement in vehicle marketability through prevention diagnosis of a battery.

It will be appreciated by persons skilled in the art that that the effects that could be achieved with the present disclosure are not limited to what has been particularly described hereinabove and other advantages of the present disclosure will be more clearly understood from the detailed description.

The aforementioned present disclosure can also be embodied as computer readable code stored on a computer readable recording medium. The computer readable recording medium is any data storage device that can store data which can thereafter be read by a computer. Examples of the computer readable recording medium include a hard disk drive (HDD), a solid state drive (SSD), a silicon disc drive (SDD), read-only memory (ROM), random-access memory (RAM), CD-ROM, magnetic tapes, floppy disks, optical data storage devices, etc.

It will be apparent to those skilled in the art that various modifications and variations can be made in the present disclosure without departing from the spirit or scope of the disclosure. Thus, it is intended that the present disclosure cover the modifications and variations of this disclosure provided they come within the scope of the appended claims and their equivalents.

What is claimed is:

1. A vehicle battery diagnosis apparatus comprising:
   a measurement unit configured to measure a battery cell voltage; and
   a controller configured to diagnose a cell voltage deviation based on the battery cell voltage,
   wherein the controller calculates a self-discharge rate for each cell based on the battery cell voltage and a parking time, and calculates the cell voltage deviation based on the battery cell voltage, and
   when the calculated cell voltage deviation is greater than a preset cell balancing reference voltage deviation, the controller compares cell balancing capacitance calculated based on a vehicle usage time with a maximum self-discharge rate among the calculated self-discharge rates for respective cells and determines whether cell balancing is enabled or diagnoses the cell voltage deviation.

2. The vehicle battery diagnosis apparatus of claim 1, wherein, when the controller calculates the self-discharge rate for each cell, if a vehicle is turned on (IG ON), the controller calculates the parking time and calculates the self-discharge rate for each cell based on the measured battery cell voltage and the calculated parking time.

3. The vehicle battery diagnosis apparatus of claim 1, wherein, when calculating the cell voltage deviation, the controller calculates the cell voltage deviation according to an equation "Cell voltage deviation $\Delta V$=Maximum cell voltage $V_{cellmax}$–Minimum cell voltage $V_{cellmin}$".

4. The vehicle battery diagnosis apparatus of claim 1, wherein, when calculating the self-discharge rate for each cell, the controller calculates the maximum self-discharge rate upon calculating the self-discharge rate for each cell.

5. The vehicle battery diagnosis apparatus of claim 1, wherein, when comparing the maximum self-discharge rate with the cell balancing capacitance, the controller checks whether the calculated cell voltage deviation $\Delta V$ is greater than the preset cell balancing reference voltage deviation $\Delta V_{balancing}$, and
wherein, when the cell voltage deviation $\Delta V$ is greater than the cell balancing reference voltage deviation $\Delta V_{balancing}$, the controller compares the maximum self-discharge rate with the cell balancing capacitance.

6. The vehicle battery diagnosis apparatus of claim 1, wherein, when the controller compares the maximum self-discharge rate with the cell balancing capacitance, if the maximum self-discharge rate is smaller than the cell balancing capacitance, the controller determines that cell balancing is enabled.

7. The vehicle battery diagnosis apparatus of claim 6, further comprising a cell balancing driver configured to perform cell balancing of a battery,
wherein, upon determining that the cell balancing is enabled, the controller controls the cell balancing driver to perform the cell balancing.

8. The vehicle battery diagnosis apparatus of claim 1, wherein, when the controller compares the maximum self-discharge rate with the cell balancing capacitance, if the maximum self-discharge rate is equal to or greater than the cell balancing capacitance, the controller diagnoses the cell voltage deviation of a battery.

9. The vehicle battery diagnosis apparatus of claim 8, further comprising a diagnosis display unit configured to display diagnosis information on diagnosis of the cell voltage deviation,
wherein the controller controls the diagnosis display unit to display the diagnosis information on diagnosis of the cell voltage deviation upon diagnosing the cell voltage deviation of the battery.

10. The vehicle battery diagnosis apparatus of claim 1, wherein, when a vehicle is turned off (IG OFF), the controller calculates the vehicle usage time, calculates and obtains an average usage time based on the vehicle usage time, calculates the cell balancing capacitance based on the average usage time, and stores the cell balancing capacitance.

11. The vehicle battery diagnosis apparatus of claim 1, wherein, when a vehicle is turned off (IG OFF), the controller stores a voltage for each cell of a battery.

12. The vehicle battery diagnosis apparatus of claim 1, wherein the controller includes:
a usage and parking time calculation unit configured to calculate the parking time and the vehicle usage time;
a self-discharge rate calculation unit configured to calculate the self-discharge rate for each cell based on the battery cell voltage and the parking time;
a learning storage unit configured to obtain and store the self-discharge rate for each cell and the cell balancing capacitance;
a cell voltage deviation calculation unit configured to calculate the cell voltage deviation based on the battery cell voltage;
a cell balancing capacitance calculation unit configured to calculate the cell balancing capacitance based on a balancing circuit discharge rate and a daily average vehicle usage time; and
a cell balancing capability determination unit configured to compare the calculated cell balancing capacitance with the maximum self-discharge rate among the calculated self-discharge rates for respective cells and to determine whether cell balancing is enabled or to diagnose the cell voltage deviation when the calculated cell voltage deviation is greater than the preset cell balancing reference voltage deviation.

13. A battery diagnosis method of a vehicle battery diagnosis apparatus including a controller configured to diagnose a cell voltage deviation based on a battery cell voltage, the method comprising:
when a vehicle is turned on (IG ON), calculating a self-discharge rate for each cell based on the battery cell voltage and a parking time and calculating a cell voltage deviation based on the battery cell voltage, by the controller;
checking whether the calculated cell voltage deviation is greater than a preset cell balancing reference voltage deviation, by the controller;
when the calculated cell voltage deviation is greater than the cell balancing reference voltage deviation, checking whether cell balancing capacitance calculated based on a vehicle usage time is greater than a maximum self-discharge rate among the calculated self-discharge rates for respective cells, by the controller; and
when the cell balancing capacitance is greater than the maximum self-discharge rate, determining that cell balancing is enabled, and when the cell balancing capacitance is equal to or less than the maximum self-discharge rate, diagnosing the cell voltage deviation, by the controller.

14. The method of claim 13, wherein the calculating a self-discharge rate for each cell includes calculating the parking time when the vehicle is turned on (IG ON), and calculating the self-discharge rate for each cell based on the measured battery cell voltage and the calculated parking time.

15. The method of claim 13, wherein the calculating a cell voltage deviation includes calculating the cell voltage deviation according to an equation:
Cell voltage deviation $\Delta V$=Maximum cell voltage $V_{cellmax}$–Minimum cell voltage $V_{cellmin}$.

16. The method of claim 13, wherein the calculating a self-discharge rate for each cell includes calculating the maximum self-discharge rate upon calculating the self-discharge rate for each cell.

17. The method of claim 13, wherein the determining that cell balancing is enabled includes performing cell balancing of a battery upon determining that the cell balancing is enabled.

18. The method of claim 13, wherein the diagnosing the cell voltage deviation includes displaying diagnosis information on diagnosis of the cell voltage deviation upon diagnosing the cell voltage deviation of a battery.

19. The method of claim 13, further comprising:
   when the vehicle is turned off (IG OFF), calculating the vehicle usage time;
   calculating and obtaining an average usage time based on the vehicle usage time; and
   calculating the cell balancing capacitance based on the average usage time and storing the cell balancing capacitance.

20. The method of claim 19, further comprising, when the vehicle is turned off (IG OFF), storing a voltage for each cell of a battery.

* * * * *